United States Patent
Cho

(10) Patent No.: US 9,330,791 B2
(45) Date of Patent: May 3, 2016

(54) MEMORY SYSTEMS AND METHODS OF MANAGING FAILED MEMORY CELLS OF SEMICONDUCTOR MEMORIES

(71) Applicant: Samsung Electronics Co., Ltd., Suwon-Si, Gyeonggi-Do (KR)

(72) Inventor: Sangyeun Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 14 days.

(21) Appl. No.: 14/326,966

(22) Filed: Jul. 9, 2014

(65) Prior Publication Data

US 2015/0143165 A1 May 21, 2015

(30) Foreign Application Priority Data

Nov. 18, 2013 (KR) .................. 10-2013-0140131

(51) Int. Cl.
*G11C 29/00* (2006.01)
*G11C 29/50* (2006.01)
*G11C 11/40* (2006.01)

(52) U.S. Cl.
CPC .......... *G11C 29/50016* (2013.01); *G11C 29/76* (2013.01); *G11C 11/40* (2013.01)

(58) Field of Classification Search
CPC ............ G06F 11/1008; G06F 12/0804; G06F 12/0246; G06F 2212/7205; G06F 2212/2022; G06F 2212/1032; G06F 12/0802; G06F 11/1666; G06F 11/20; G06F 12/126; G11C 5/04; G11C 29/808; G11C 29/82; G11C 2029/0409; G11C 13/0004; G11C 13/004
See application file for complete search history.

(56) References Cited

U.S. PATENT DOCUMENTS

| | | | |
|---|---|---|---|
| 5,249,286 A | 9/1993 | Alpert et al. | |
| 5,402,377 A * | 3/1995 | Ohhata | G11C 29/70 365/200 |
| 6,467,048 B1* | 10/2002 | Olarig | G11C 29/70 714/54 |
| 6,505,305 B1* | 1/2003 | Olarig | G11C 29/76 714/5.11 |
| 6,820,224 B1 | 11/2004 | Lin et al. | |
| 7,492,652 B2 | 2/2009 | Martin et al. | |
| 7,770,077 B2* | 8/2010 | Arimilli | G06F 12/0802 714/710 |

(Continued)

FOREIGN PATENT DOCUMENTS

| | | |
|---|---|---|
| JP | H11-282764 A | 10/1999 |
| JP | 2000-330875 A | 11/2000 |

(Continued)

OTHER PUBLICATIONS

Chen,C., "Fault-Containment in Cache Memories for TMR Redundant Processor Systems", IEEE Transactions on Computers, Apr. 1999, vol. 48, No. 4, 12pgs.

*Primary Examiner* — Guerrier Merant
(74) *Attorney, Agent, or Firm* — Harness, Dickey & Pierce, P.L.C.

(57) ABSTRACT

A memory system includes a memory controller configured to replace a memory block including a failed memory cell with a unit cache block of a cache memory in response to detection of the failed memory cell in the memory block. The unit cache block is smaller than a minimum size of a memory cell array capable of being blocked by an operating system, and the unit cache block has substantially the same storage capacity as the memory block.

17 Claims, 14 Drawing Sheets

(56) References Cited

U.S. PATENT DOCUMENTS

| | | |
|---|---|---|
| 7,809,920 B2 | 10/2010 | Watanabe et al. |
| 7,827,360 B2 | 11/2010 | Rahman et al. |
| 8,386,702 B2 | 2/2013 | Thayer et al. |
| 2006/0080572 A1 | 4/2006 | Fong |
| 2007/0234112 A1 | 10/2007 | Thayer et al. |
| 2008/0229003 A1* | 9/2008 | Mizushima ......... G06F 12/0804 711/103 |
| 2009/0282301 A1* | 11/2009 | Flynn ................... G06F 11/006 714/710 |
| 2010/0146239 A1* | 6/2010 | Gabai ................. G06F 12/0246 711/202 |
| 2012/0311248 A1 | 12/2012 | Goodman |
| 2014/0143593 A1* | 5/2014 | Strauss ............... G06F 12/0246 714/6.13 |

FOREIGN PATENT DOCUMENTS

| | | |
|---|---|---|
| JP | 2008-065745 A | 3/2008 |
| JP | 2009122826 A | 6/2009 |

\* cited by examiner

MEMORY SYSTEMS AND METHODS OF MANAGING FAILED MEMORY CELLS OF SEMICONDUCTOR MEMORIES

CROSS-REFERENCE TO RELATED APPLICATIONS

This U.S. non-provisional patent application claims priority under 35 U.S.C. §119 to Korean Patent Application No. 10-2013-0140131, filed on Nov. 18, 2013, the entire contents of which are hereby incorporated by reference.

BACKGROUND

1. Field

Example embodiments of inventive concepts relate to memory systems, and more particularly, to memory systems having failed memory cells and methods of managing failed memory cells.

2. Description of Conventional Art

A dynamic random access memory DRAM or a magnetic random access memory MRAM can be used as a main memory of a memory system.

In a DRAM, a failed memory cell may exist in a memory cell array. A hard-failed memory cell among failed memory cells is replaced with a spare memory cell through a repair process.

A soft-failed memory cell among failed memory cells can be divided into a faulty memory cell and a weak memory cell. In the case that a faulty memory cell exists in a memory cell array, a masking off operation of inhibiting an access operation with respect to a corresponding memory cell is desired. In the case that a weak memory cell exists in a memory cell array, since its operation is similar to an operation of a normal memory cell having relatively high reliability of data access, a relatively frequent refresh operation may be desired.

However, a frequent refresh operation of a weak memory cell may increase power consumption.

A unit of memory that is masked off when a faulty memory cell or a weak memory cell occurs may be a page frame unit, which includes a plurality of memory blocks of a memory cell array. However, masking off a plurality of memory blocks due to one failed memory cell results in wasted memory capacity.

SUMMARY

At least some example embodiments of inventive concepts provide methods of managing failed memory cells of semiconductor memories. When at least one failed memory cell is detected in a memory block of a memory cell array, at least one unit cache block of a cache memory is assigned as a replacement for the memory block. The memory block including the failed memory cell is then replaced (e.g., permanently replaced) with the unit cache block. The at least one unit cache block is smaller than a page frame unit of the memory cell array, and the page frame unit is the smallest unit capable of being blocked by an operating system. The at least one unit cache block also has the same memory capacity as a storage capacity of the memory block.

At least one example embodiment provides a method of managing failed memory of a semiconductor memory. According to at least this example embodiment, the method includes: assigning at least one unit cache block as a replacement for at least one memory block of a page frame unit of a memory cell array in response to detection of at least one failed memory cell of the at least one memory block, the at least one unit cache block being smaller than the page frame unit of the memory cell array, the at least one unit cache block having a same storage capacity as the at least one memory block, and the page frame unit being a minimum size of the memory cell array capable of being blocked by an operating system; and replacing the at least one memory block including the at least one failed memory cell with the at least one unit cache block.

According to at least some example embodiments, the at least one failed memory cell may be a soft-failed memory cell, a faulty memory cell or a weak memory cell.

The method may further include: testing the memory cell array to detect the at least one failed memory cell. The testing of the memory cell array may be performed prior to operation of the operating system. Alternatively, the testing of the memory cell array may be performed periodically during access of a memory including the memory cell array and after an operation of the operating system is completed.

The at least one unit cache block replacing the at least one memory block may be locked in software and no longer usable as cache memory.

The at least one unit cache block may be part of a lowest level cache memory among a plurality of cache memories utilized by the operating system.

The at least one memory block may not be recognized as a failed memory block by a processor executing the operating system.

The memory cell array may be part of a dynamic random access memory (DRAM) being used as a main memory.

The memory cell array may be part of a magnetic random access memory (MRAM) having a plurality of spin-transfer torque MRAM (STT MRAM) cells being used as a main memory.

At least one other example embodiment provides a memory system including: a memory including a memory cell array, the memory cell array including a plurality of memory blocks, each of the plurality of memory blocks including a plurality of memory cells; a cache memory including a plurality of unit cache blocks, each of the plurality of unit cache blocks being smaller than a page frame unit of the memory cell array, the page frame unit being a minimum size of the memory cell array capable of being blocked by an operating system, and the plurality of unit cache blocks having a same storage capacity as the plurality of memory blocks; and a memory controller configured to replace a memory block having a failed memory cell with a corresponding one of the plurality of unit cache blocks in response to detection of the failed memory cell in the memory block.

According to at least some example embodiments, the corresponding one of the plurality of unit cache blocks may be locked in software to permanently replace the memory block having the failed memory cell. When an address for accessing the memory block having the failed memory cell is applied to the memory controller, the corresponding one of the plurality of unit cache blocks may be accessed instead of the memory block having the failed memory cell.

At least one other example embodiment provides a memory system including: a memory controller configured to replace a memory block having a failed memory cell with a unit cache block of a cache memory in response to detection of the failed memory cell in the memory block, the unit cache block being smaller than a minimum size of a memory cell array capable of being blocked by an operating system, and the unit cache block having substantially the same storage capacity as the memory block.

According to at least some example embodiments, the failed memory cell may be a soft-failed memory cell, a faulty memory cell or a weak memory cell. The unit cache block replacing the memory block may be locked in software and no longer usable as a cache memory. The memory controller may be configured to access the unit cache block instead of the memory block having the failed memory cell in response to an address for accessing the memory block having the failed memory cell.

The memory system may further include: a memory including the memory cell array having a plurality of memory blocks, the plurality of memory blocks including the memory block with the failed memory cell; and the cache memory including the unit cache block.

BRIEF DESCRIPTION OF THE FIGURES

Example embodiments of inventive concepts will be described below in more detail with reference to the accompanying drawings. Example embodiments of inventive concepts may, however, be embodied in different forms and should not be constructed as limited to the example embodiments set forth herein. Rather, these example embodiments are provided so that this disclosure will be thorough and complete, and will fully convey the scope of the inventive concept to those skilled in the art. Like numbers refer to like elements throughout.

DETAILED DESCRIPTION

Figure 1:
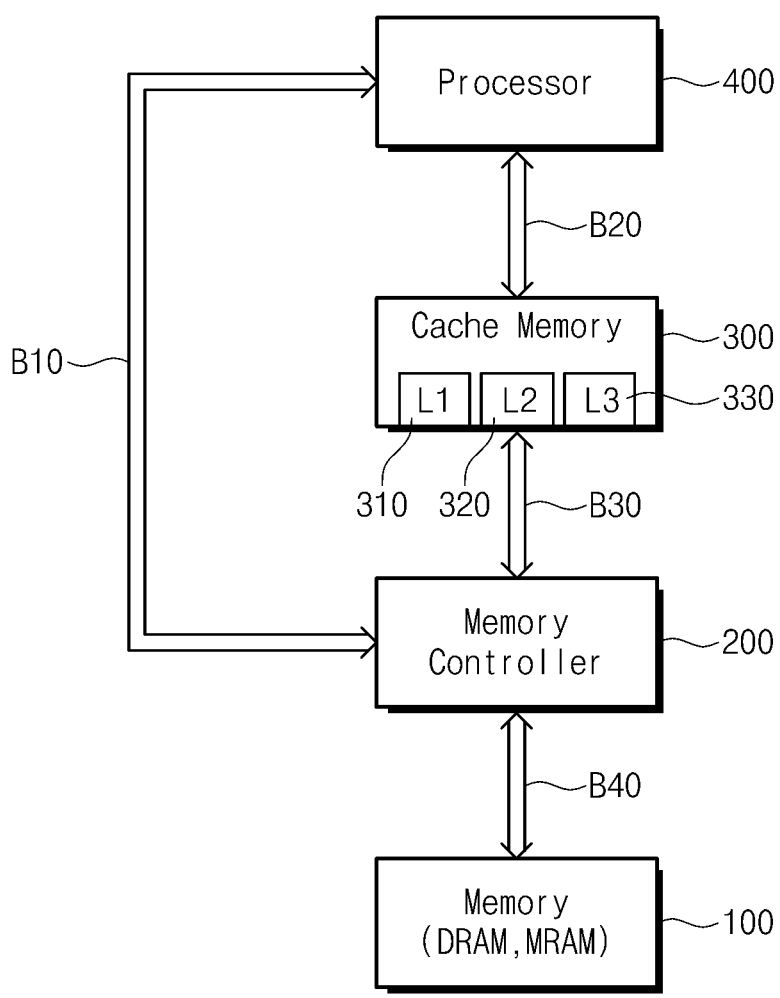
FIG. 1 is a block diagram of a memory system according to an example embodiment of inventive concepts.

Example embodiments will now be described more fully with reference to the accompanying drawings. Inventive concepts may, however, be embodied in many different forms and should not be construed as being limited to the exemplary embodiments set forth herein; rather, these embodiments are provided so that this disclosure will be thorough and complete, and will fully convey the concept of the invention to those skilled in the art.

In the drawings, like reference numerals refer to like elements, and redundant descriptions thereof will be omitted. Furthermore, various elements and regions in the drawings are schematically drawn. Thus, the inventive concept is not limited by a relative size or distance drawn in the attached drawings.

It will be understood that, although the terms first and second etc. may be used herein to describe various elements, components, regions, layers and/or sections, these elements, components, regions, layers and/or sections should not be limited by these terms. These terms are only used to distinguish one element, component, region, layer or section from another element, component, region, layer or section. For example, a first element could be termed a second element, and similarly, a second element could be termed a first element without departing from the teachings of the example embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, for example, illustrated shapes may be deformed according to fabrication technology and/or tolerances. Therefore, the example embodiments of inventive concepts are not limited to certain shapes illustrated in the present specification, and may include modifications of shapes caused in fabrication processes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Inventive concepts will be described more fully hereinafter with reference to the accompanying drawings, in which example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

FIG. 1 is a block diagram of a memory system in accordance with an example embodiment of inventive concepts.

Referring to FIG. 1, a memory system includes a memory 100, a memory controller 200, and a cache memory 300.

The cache memory 300 is connected to the memory controller 200 through a bus B30.

The cache memory 300 is connected to a processor 400 such as a CPU or a microprocessor through a bus B20.

The cache memory 300 may include a L1 cache 310, a L2 cache 320 and a L3 cache 330 according to a cache function level.

The memory 100 can function as a main memory in a system of FIG. 1 and can be constituted by a DDR2, 3, 4 DRAM (dynamic random access memory) or a MRAM (magnetic random access memory).

The memory 100 includes a memory cell array having multiple memory blocks. The memory block is constituted by a plurality of memory cells. In the case that the memory cell is a DRAM cell, a refresh operation for data retention is performed. In the case that the memory cell is a MRAM cell, since the stored data is maintained even when power is turned off, a refresh operation is not needed.

The L3 cache 330 which is a cache memory of the lowest level of the cache memory 300 can be embodied by one of a SRAM (static random access memory), a DRAM, a MRAM and a PRAM (phase change random access memory). The L3 cache 330 can have a plurality of unit cache blocks smaller than a page frame unit of a memory cell array of the memory 100 being blocked by an operating system OS and having the same memory capacity as a storage capacity of the memory block.

When at least one failed memory cell is detected in the memory blocks of the memory 100, the memory controller 200 replaces a corresponding memory block including the defective memory cell with the unit cache block in the L3 cache 330.

The replaced unit cache block is locked and cannot perform a function as a cache memory any more. The replaced unit cache block functions as the memory blocks of the memory 100. In the case that an access to the corresponding memory block including the failed memory cell is requested, an access to the memory block is blocked and the unit cache block is accessed. Thus, when a data write operation is performed, write data is written in the unit cache block. When a data read operation is performed, read data is read from the unit cache block.

Since a capacity that spares the unit cache block in the cache memory is far smaller than a page frame unit of a memory cell array being blocked by the operating system OS, a waste of a maim memory is minimized. To reduce a memory size being masked, a memory block smaller than the page frame unit is masked off without masking off the page frame unit in the memory 100 and the unit cache block is sacrificed instead.

Figure 2:
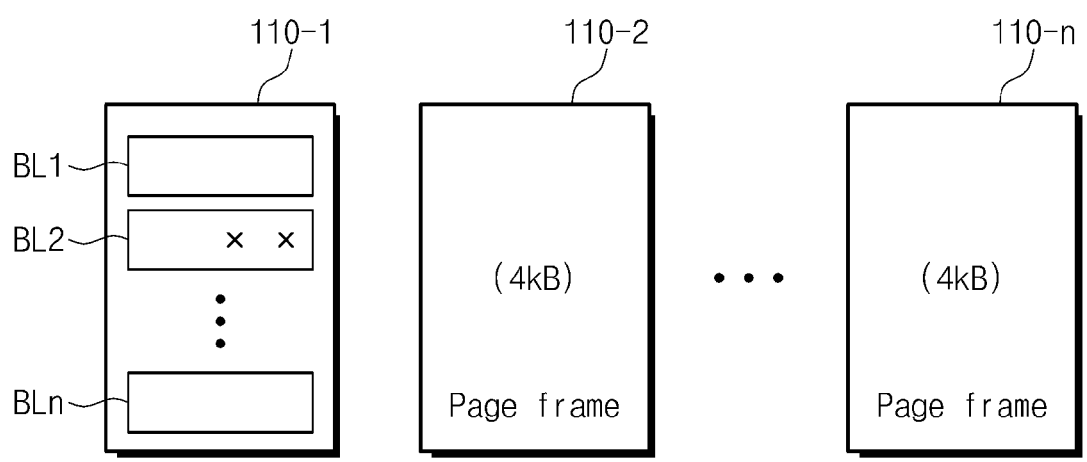
FIG. 2 is a drawing illustrating an example page frame unit of a memory in accordance with FIG. 1.

FIG. 2 is a drawing illustrating a page frame unit of a memory in accordance with FIG. 1.

Referring to FIG. 2, the memory cell array of the memory 100 includes a plurality of memory blocks. The memory cell array may include a plurality of page frame units 110-1, 110-2, . . . , 110-n. One page frame unit includes a plurality of memory blocks BL1, BL2, . . . , BLn. One memory block may have a memory capacity of 64 byte (64 B) and one page frame unit may have a memory capacity of 4 kilobyte (4 kB).

Thus, a memory capacity of one page frame unit is far greater than a memory capacity of one memory block.

In the case that a failed memory cell (F/W MC) indicating a faulty memory cell or a weak memory cell exists in the memory cell array of the memory 100 of FIG. 1, an operating system OS of the processor 400 masks off the whole page frame unit 110-1 including the F/W MC. That is, the minimum masking off unit of the operating system OS is a page frame unit 110-1. Thus, in the case of FIG. 2, although F/W MC exists only in the second memory block BL2, the remaining memory blocks BL1, BL3, . . . , BLn are all masked off.

Since a masking off of a page frame unit is performed, it is wasteful of main memories. To solve a problem of a waste of memory, in at least one example embodiment of inventive concepts, replacement of a memory block unit is performed using a cache memory. Thus, only a memory block including F/W MC is masked off by an operation of the memory controller 200.

Since a plurality of memory blocks is not all masked off due to one failed memory cell, a memory can be saved.

Figure 3:
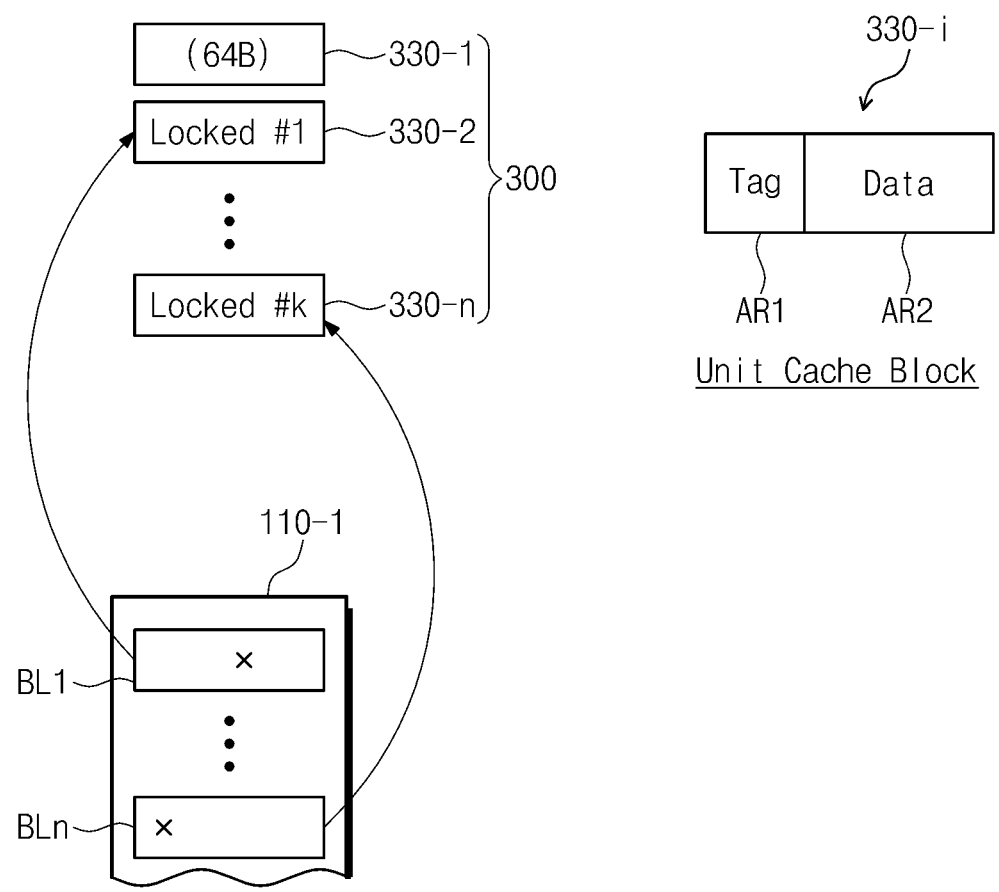
FIG. 3 is a drawing illustrating an example replacement of a memory block unit in accordance with FIG. 1.

FIG. 3 is a drawing illustrating an example replacement of a memory block unit in accordance with FIG. 1.

Referring to FIG. 3, if at least one F/W MC exist in the first memory block BL1, the first memory block BL1 is replaced with a unit cache block 330-2 in the cache memory 300. If at least one F/W MC exist in the nth memory block BLn, the nth memory block BLn is replaced with a unit cache block 330-n in the cache memory 300. Here, a memory capacity of the memory block may be equal to or smaller than a memory capacity of the unit cache block. For example, although it is not limited, a memory capacity of the unit cache block may be assigned 64 B. The unit cache block which replaces the memory block is locked in software or firmware. The locked unit cache block functions as the memory block and does not perform a function of the cache memory any more.

The unit cache block is locked by the memory controller 200 or the processor 400 receiving a request of the memory controller 200.

A unit cache block 330-1 may include a data area AR2 for storing data and a tag area AR1 for storing address information of data stored in the data area AR2.

Figure 4:
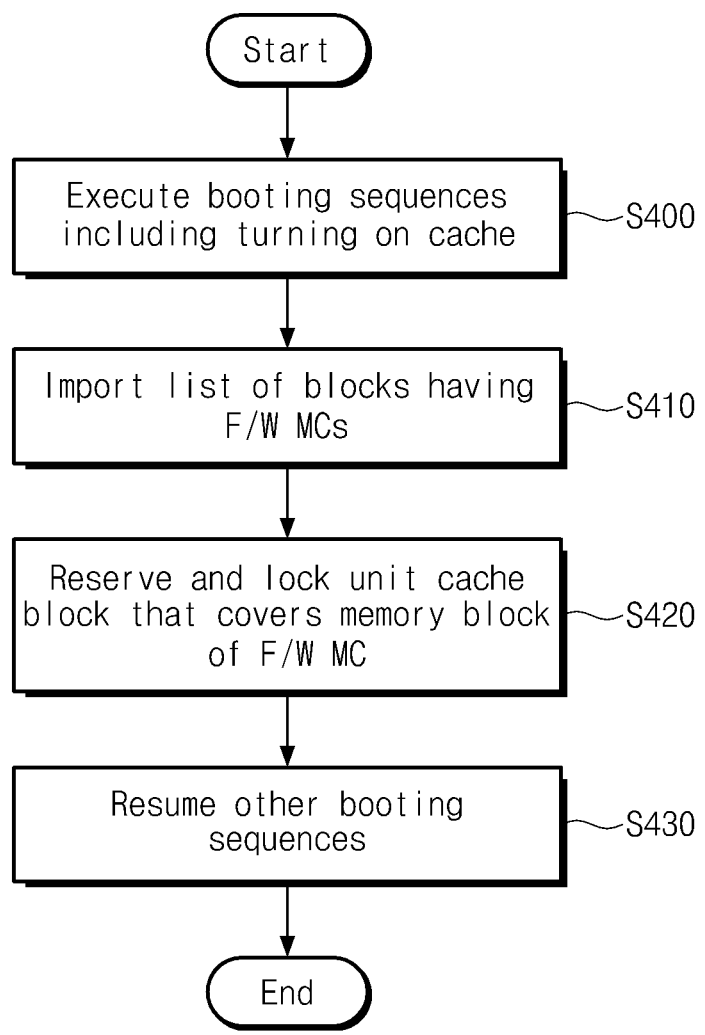
FIG. 4 is a flow chart illustrating an example replacement operation when a booting operation is performed in accordance with FIG. 1.

FIG. 4 is a flow chart illustrating an example replacement operation when a booting operation is performed in accordance with FIG. 1.

In a step S400, booting sequences are executed. The booting sequences include turning on a cache memory.

In a step S410, a list of memory blocks having F/W MCs is imported. When a booting operation is performed, the memory controller 200 can transmit the list to the processor 400. The list may be address information of the memory blocks having F/W MCs.

In a step S420, a unit cache block covering a memory block having F/W MCs is reserved and locked in the cache memory. The unit cache block locked by performing the step S420 functions as a memory block corresponding to a DRAM or a MRAM. The memory block having F/W MCs is masked off to be permanently access-inhibited.

If an operation of the step S420 is completed, in a step S430, other booting sequences are resumed.

An operation of FIG. 4 can be performed by the memory controller 200 or cooperation of the memory controller 200 and the processor 400. Example embodiments of inventive concepts are not limited thereto.

Figure 5:
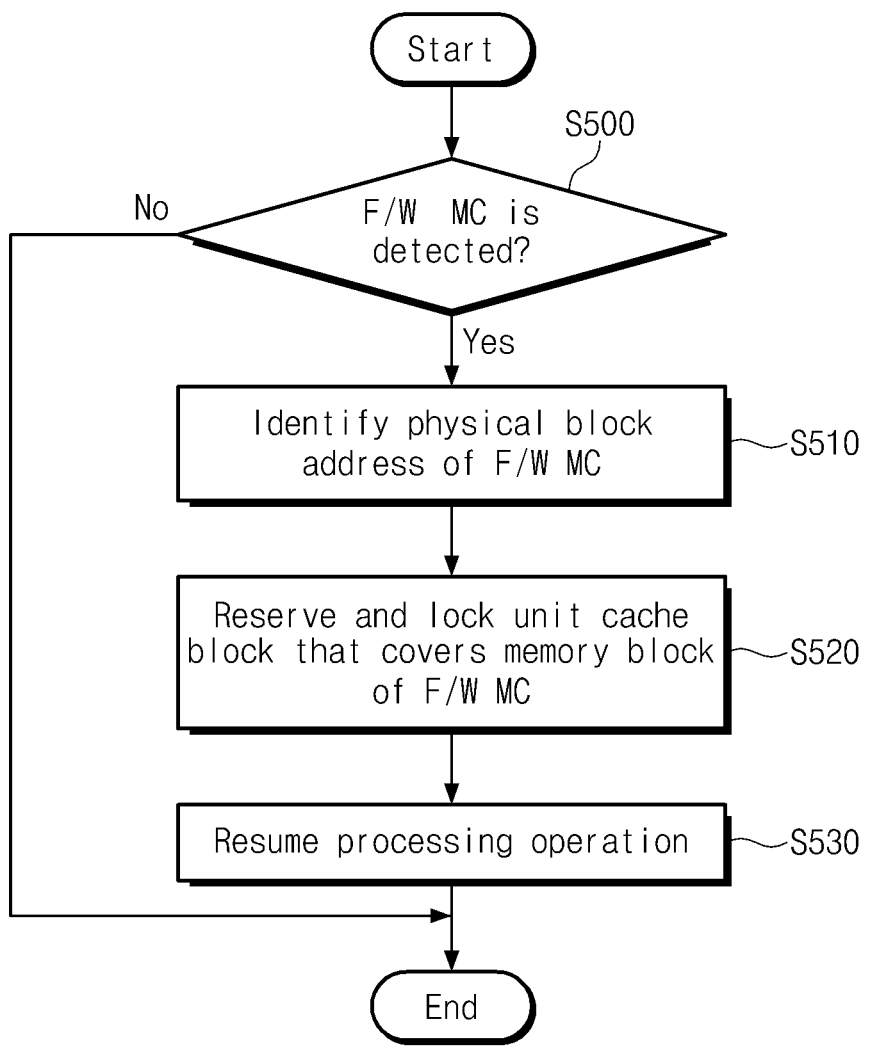
FIG. 5 is a flow chart illustrating an example replacement operation when a processing operation is performed in accordance with FIG. 1.

FIG. 5 is a flow chart illustrating an example replacement operation when a processing operation is performed in accordance with FIG. 1.

In a step S500, it is checked whether a failed memory cell, that is, F/W MC is detected or not. The check operation may be periodically executed while a system operates or may be executed when an event occurs.

In a step S510, a physical block address of memory blocks having F/W MC is identified. Accordingly, a physical block address of memory blocks having F/W MC is determined. The physical block address is an address corresponding to a logical block address and means an address of a memory block substantially located in the memory cell array.

In a step S520, a unit cache block covering a memory block having F/W MCs is reserved and locked in the cache memory. The unit cache block locked by performing the step S520 functions as a memory block corresponding to a main memory. The memory block having F/W MCs is masked off to be permanently access-inhibited.

If a replacement operation of the step S520 is completed, in a step S530, a processing operation is resumed.

An operation of FIG. 5 can be performed by the memory controller 200 or cooperation of the memory controller 200 and the processor 400. Example embodiments of inventive concepts are not limited thereto.

According to FIGS. 4 and 5, after a memory cell array is tested which includes multiple memory blocks constituted by a plurality of memory cells, if at least one failed memory cell are detected in the memory blocks, at least one unit cache block having a memory capacity smaller than a page frame unit of the memory cell array being blocked by a minimum unit by an operating system and is equal or substantially equal to a storage capacity of the memory block is assigned to a cache memory.

The unit cache block permanently replaces a corresponding memory block including the failed memory cell.

Figure 6:
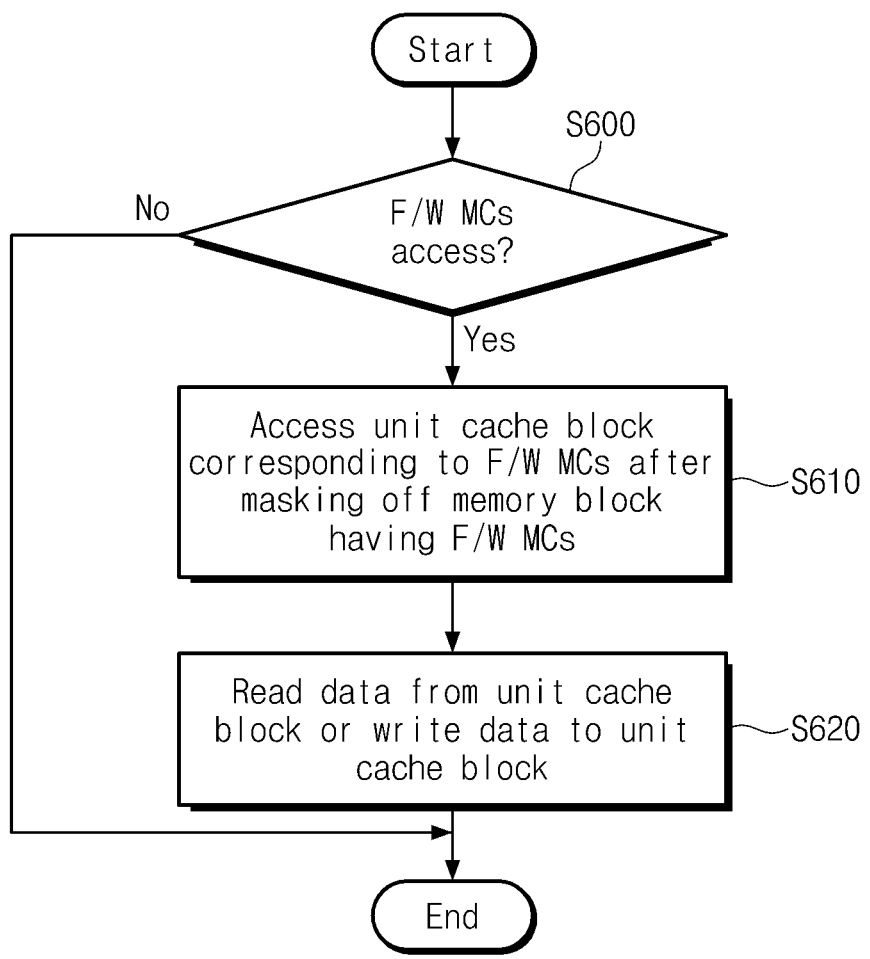
FIG. 6 is a flow chart of an example access replacement operation in accordance with FIG. 1.

FIG. 6 is a flow chart of an example access replacement operation in accordance with FIG. 1.

In a step S600, it is checked whether a request for accessing a failed memory cell, that is, F/W MC occurs or not. Since the processor 400 cannot recognize that a memory block is replaced with a corresponding unit cache block, the processor 400 can provide a request for accessing F/W MC to the memory controller 200.

In a step S610, after masking off memory blocks having F/W MC, the memory controller 200 accesses a unit cache block corresponding to the memory blocks having F/W MC. The unit cache block functions as a memory block for reading or writing data.

In a step S620, in the case of a read operation, data stored in the unit cache block is read. In the case of a write operation, write data is written in the unit cache block.

Figure 7:
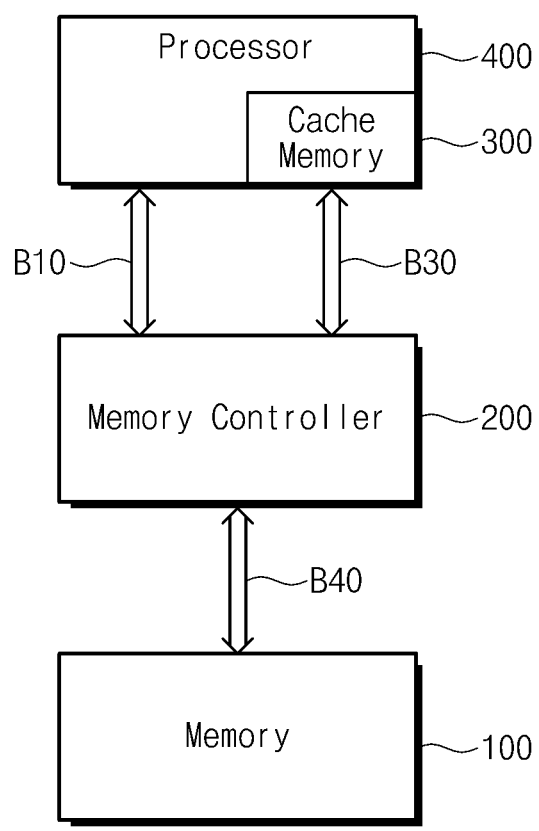
FIG. 7 is a block diagram of a memory system in accordance with another example embodiment.

FIG. 7 is a block diagram of a memory system in accordance with another example embodiment of inventive concepts.

Referring to FIG. 7, a constitution of FIG. 7 is the same as the constitution of FIG. 1, except that the cache memory 300 is built in the processor 400.

A memory system includes the memory 100, the memory controller 200 and the processor 400 having the cache memory 300.

The cache memory 300 is connected to the memory controller 200 through the bus B30.

The cache memory 300 performs a data communication with the processor 400 through an internal bus.

The cache memory 300 may include at least one of a L1 cache, a L2 cache and a L3 cache according to a cache function level.

The memory 100 can function as a main memory in the memory system of FIG. 7 and may be constituted by DDR2, 3, 4, a SDRAM or a MRAM.

The memory 100 includes a memory cell array having multiple memory blocks. The memory block is constituted by a plurality of memory cells. In the case that the memory cell is a DRAM cell, a refresh operation for data retention is performed. In the case that the memory cell is a MRAM cell, since the stored data is maintained even when power is turned off, a refresh operation is not needed.

The cache memory 300 can be embodied by one of a SRAM, a DRAM, a MRAM and a PRAM. The cache memory 300 may have a plurality of unit cache blocks having a memory capacity smaller than a page frame unit of a memory cell array of the memory 100 being blocked by an operating system OS and equal to a storage capacity of the memory block.

When at least one failed memory cell is detected in the memory blocks of the memory 100, the memory controller 200 replaces a corresponding memory block including the defective memory cell with the unit cache block in the cache memory 300.

The replaced unit cache block is locked and cannot perform a function as a cache memory any more. The replaced unit cache block functions as the memory blocks of the memory 100. In the case that an access to the corresponding memory block including the failed memory cell is requested, an access to the memory block is blocked and the unit cache block is accessed. Thus, when a data write operation is performed, write data is written in the unit cache block. When a data read operation is performed, read data is read from the unit cache block.

A capacity that the unit cache block in the cache memory is sacrificed is far smaller than the page frame unit of the memory cell array being blocked by the operating system OS.

In the case that a main memory is constituted by a DRAM, if a memory block including a weak memory cell is replaced with the unit cache block, a refresh performance is improved. That is, since a refresh operation frequently being performed for the weak memory cells is minimized or reduced, power consumption of the memory system is reduced.

A test for determining a failed memory cell in the memory block may be performed periodically or when a booting operation is performed by applying a mode register set (MRS) signal to the memory controller 200 and the memory 100.

In FIG. 7, the memory 100 can be embodied by a nonvolatile memory. The nonvolatile memory may be, for example, an electrically erasable programmable read-only memory (EEPROM), a flash memory, a magnetic random access memory (MRAM), a spin-transfer torque (STT) MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

FIG. 8A through 8D are drawings illustrating example applications of example embodiments of inventive concepts applied to a memory system having various interfaces.

Figure 8A:
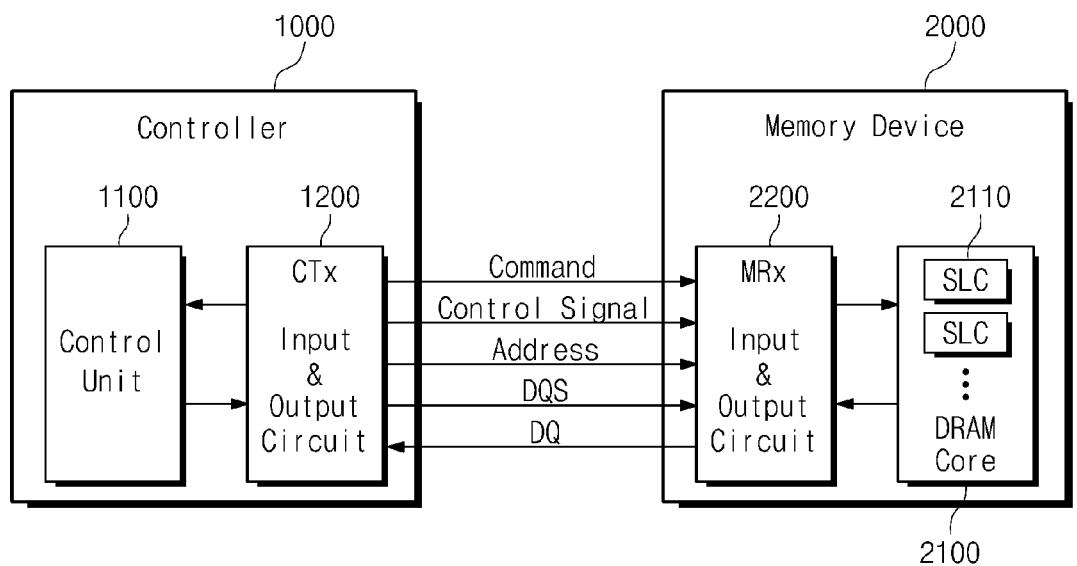
FIG. 8A through 8D are drawings illustrating example applications of example embodiments applied to a memory system having various interfaces.

Referring to FIG. 8A, a memory system is constituted by a controller 1000 and a memory device 2000. The controller 1000 is constituted by a control unit 1100 and an input and output circuit 1200. The memory device 2000 is constituted by a DRAM core including a sensing and latch circuit 2110, and an input and output circuit 2200. The input and output circuit 1200 of the controller 1000 includes an interface transmitting a command, a control signal, an address and a data strobe DQS to the memory device 2000 and transmitting and receiving data DQ. The DRAM core 2110 may be embodied by the memory 100 of FIG. 1.

Thus, in the case that a memory block including a failed memory cell exists, the corresponding memory block may be replaced with a unit cache block of a cache memory.

With regard to FIGS. 8A through 8D, one or more of the controller 1000, the control unit 1100, the input and output circuit 1200, and the input and output circuit 2200 may be at least partially implemented as hardware, firmware, hardware executing software or any combination thereof. When implemented as hardware, such hardware may include, inter alia, one or more Central Processing Units (CPUs), digital signal processors (DSPs), application-specific-integrated-circuits (ASICs), field programmable gate arrays (FPGAs) computers or the like configured as special purpose machines to perform the functions of the one or more of the controller 1000, the control unit 1100, the input and output circuit 1200, and/or the input and output circuit 2200. CPUs, DSPs, ASICs and FPGAs may generally be referred to as processors and/or microprocessors.

Figure 8B:
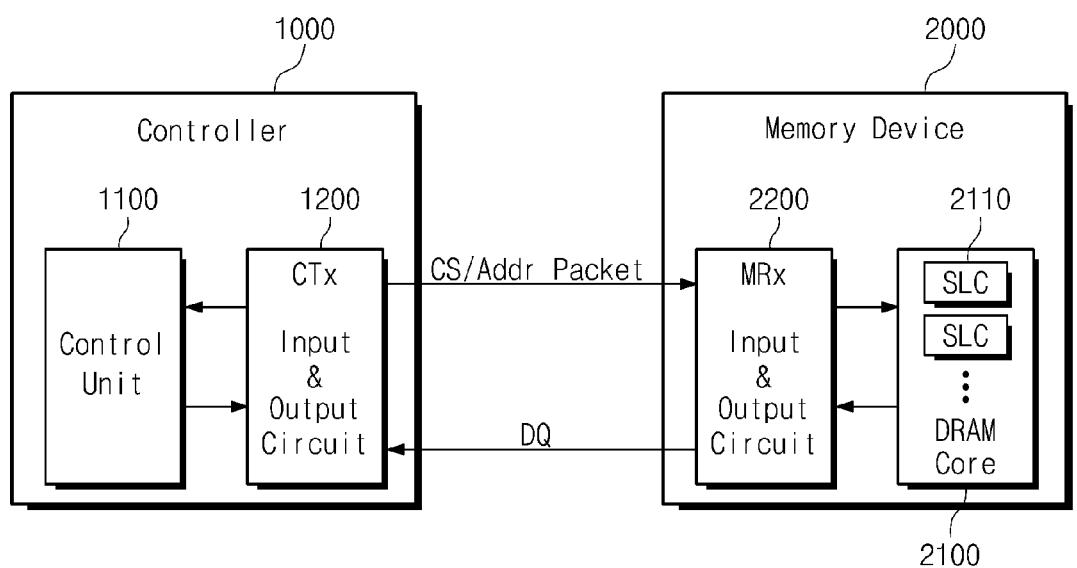

Referring to FIG. 8B, the input and output circuit 1200 of the controller 1000 includes an interface transmitting a chip selection signal CS and an address by one packet and transmitting and receiving data DQ.

Figure 8C:
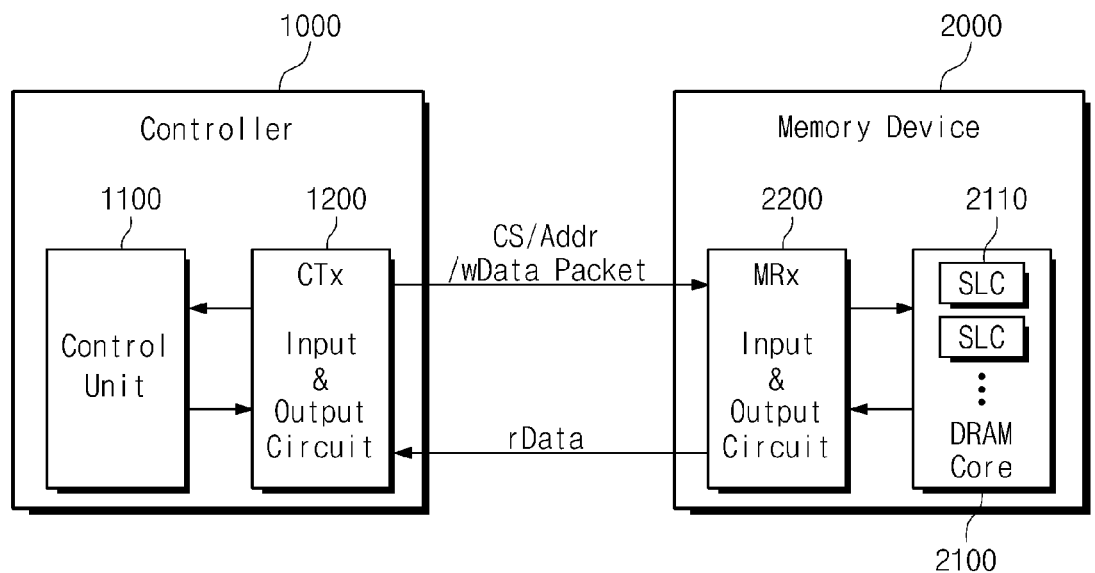

Referring to FIG. 8C, the input and output circuit 1200 of the controller 1000 includes an interface transmitting a chip selection signal CS, an address and write data (wData) by one packet and receiving read data (rData).

Figure 8D:
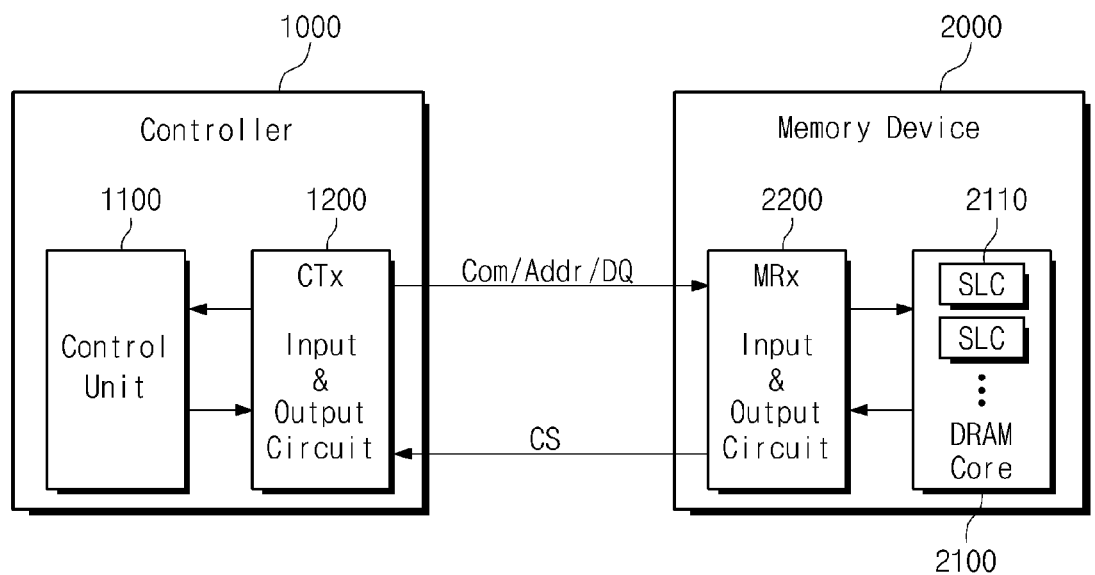

Referring to FIG. 8D, the input and output circuit 1200 of the controller 1000 includes an interface transmitting and receiving a command, an address and data DQ and receiving a chip selection circuit CS.

In FIGS. 8B through 8D, in the case that a memory block including a failed memory cell exists, the corresponding memory block may be replaced with a unit cache block of a cache memory according to a controlling operation of the controller 1000.

Figure 9:
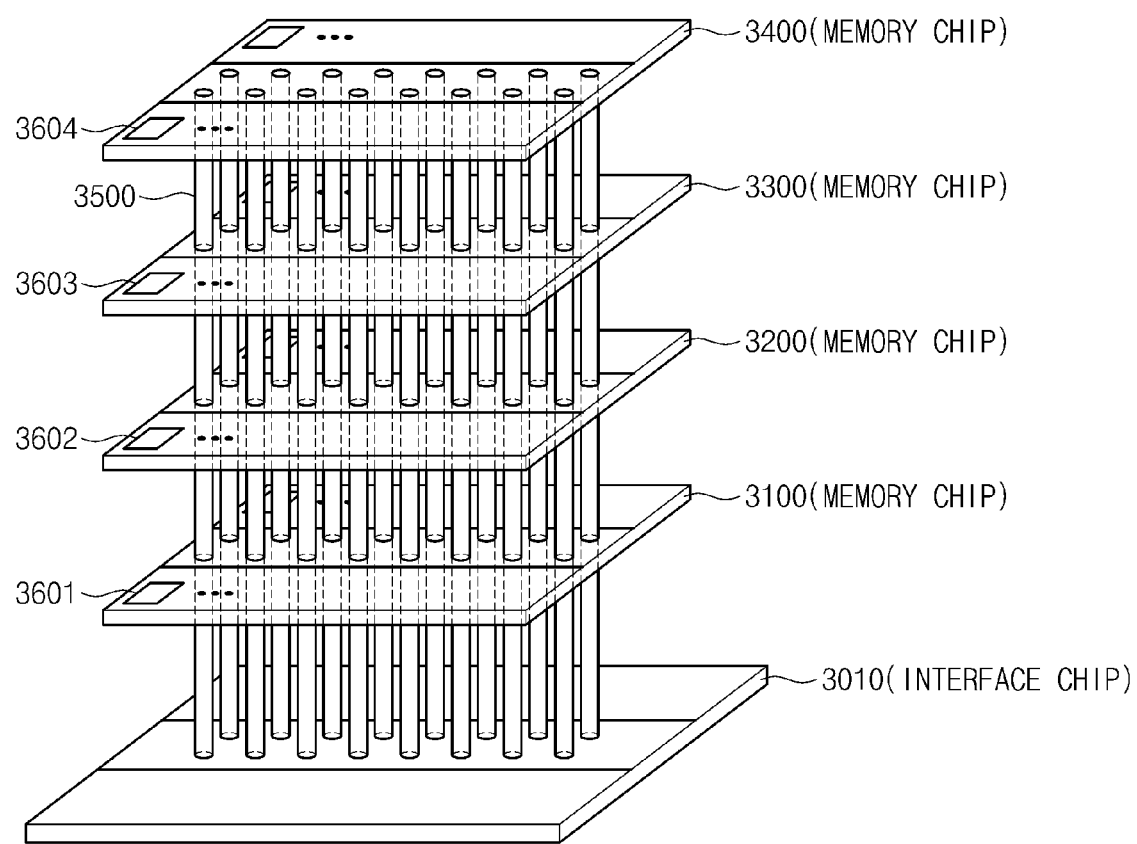
FIG. 9 is a drawing illustrating an example application of example embodiments of inventive concepts applied to a memory system stacked through a through-silicon-via (TSV).

FIG. 9 is a drawing illustrating an example application of example embodiments of inventive concepts applied to a memory system stacked through a through-silicon-via (TSV).

Referring to FIG. 9, an interface chip 3010 is located on the lowest layer and memory chips 3100, 3200, 3300 and 3400 are located on the interface chip 3010. The memory chips 3100, 3200, 3300 and 3400 include sensing and latch circuits 3601, 3602, 3603 and 3604 respectively. The memory chips 3100, 3200, 3300 and 3400 are connected to one another through micro bumps (uBump) 3500 or through silicon via (TSV). The number of stacked memory chips may be one or more.

The memory chips 3100, 3200, 3300 and 3400 can be embodied by the memory 100 of FIG. 1.

Figure 10:
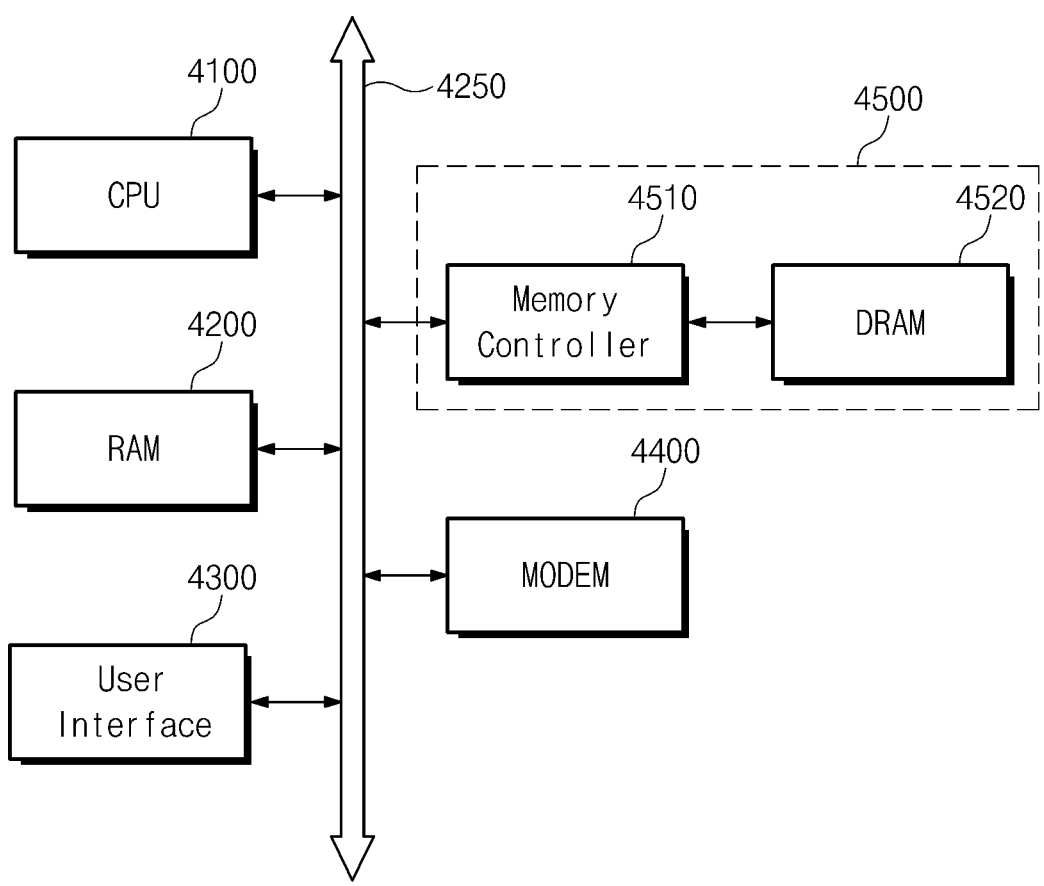
FIG. 10 is a block diagram illustrating an example application of example embodiments of inventive concepts applied to a computing device.

FIG. 10 is a block diagram illustrating an example application of example embodiments of inventive concepts applied to a computing device.

Referring to FIG. 10, a computing device may include a memory system 4500 including a DRAM 4520 and a memory controller 4510. The memory system 4500 can be embodied like FIG. 1.

The computing device may include an information processing device or a computer. For example, the computing device may include the memory system 4500 and a modem 4400, a CPU 4100, a RAM 4200, a user interface 4300 that are electrically connected to a system bus 4250. The memory system 4500 may store data processed by the CPU 100 or data input from the outside.

The computing device can be applied to a solid state disk (SSD), a camera image processor and an application chipset. The memory system 4500 can be constituted by a SSD. In this case, the computing device can stably and reliably store large amounts of data in the memory system 4500.

The DRAM 4520 constituting the memory system 4500 can be embodied by the memory 100 of FIG. 1. Thus, a waste of memory can be improved.

The memory controller 4510 can channel-independently apply a command, an address, data or a control signal to the DRAM 4520.

The CPU 4100 functions as a host and controls the whole operation of the computing device.

A host interface between the CPU 4100 and the memory controller 4510 includes various protocols for performing a data exchange between the host and the memory controller 4500. The memory controller 4510 may be configured to communicate with the host or the outside through at least one of various interface protocols such as a universal serial bus (USB), a multimedia card (MMC) interface, a PCI express interface, a serial ATA, a parallel ATA, a small computer system interface (SCSI), a serial attached SCSI (SAS) interface, an enhanced small disk interface (ESDI) and an integrated drive electronics (IDE) interface.

The computing device may be provided as one of various constituent elements of electronic devices such as a computer, an ultra mobile PC (UMPC), a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

The DRAM 4520 chip or the CPU 4100 can be mounted separately or together using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Figure 11:
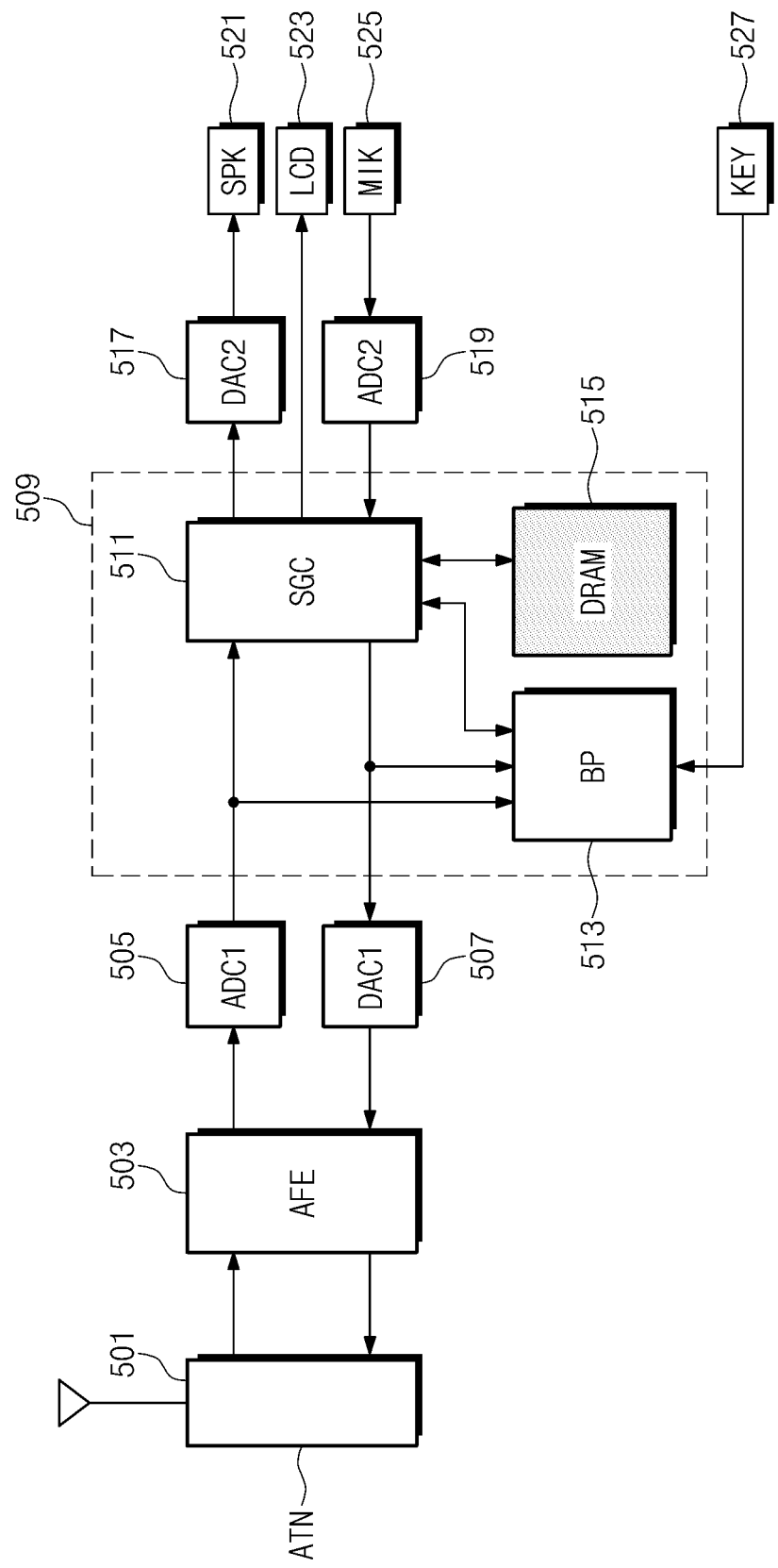
FIG. 11 is a block diagram illustrating an example application of example embodiments of inventive concepts applied to a smart phone.

FIG. 11 is a block diagram illustrating an example application of example embodiments of inventive concepts applied to a smart phone.

Referring to FIG. 11, a block diagram of an important part of a cellular phone such as a smart phone with a built-in DRAM is illustrated. A smart phone may include an antenna (ATN) 501, an analog front end block (AFE) 503, analog-digital converting circuits (ADC1) 505 and (ADC2) 519, digital-analog converting circuits (DAC1) 507 and (DAC2) 517, a base band block (BBD) 509, a speaker (SPK) 521, a liquid crystal display (LCD) 523, a mike (MIK) 525, and an input key (KEY) 527. Although not illustrated, the analog front end block (AFE) 503 is constituted by an antenna switch, a band pass filter, all sorts of amplifiers, a power amplifier, a phase locked loop (PLL), a voltage control oscillator, an orthogonal demodulator, and an orthogonal modulator to execute a transmit/receive of a radio wave. The base band block 509 may include a signal processing circuit (SGC) 511, a baseband processor (BP) 513, and a DRAM 515.

An operation of the smart phone of FIG. 11 is described. In the case that an image including voice and character information is received, a radio wave input from an antenna is input to the analog-digital converting circuit (ADC1) 505 through the analog front end block (AFE) 503 to be waveform-equalized and converted from an analog waveform into a digital waveform. An output signal of the ADC1 505 is input to the signal processing circuit (SGC) 517 in the base band block 509 to be voice and image-processed and the voice signal is transmitted to the speaker 521 through the digital-analog converting circuit (DAC2) 517 and the image signal is transmitted to the liquid crystal display (LCD) 523.

In the case of transmitting a voice signal, a signal input from the mike 525 is input to the signal processing circuit (SGC) 511 through the analog-digital converting circuit (ADC2) 519 to be voice-processed. An output of the SGC 511 is transmitted from the digital-analog converting circuit (DAC1) 507 to the antenna 501 through the analog front end block (AFE) 503. In the case of transmitting character information, a signal input from the input key 527 is transmitted to the antenna 501 sequentially through the base band block 509, the digital analog converting circuit 507 and the analog front end block (AFE) 503.

In FIG. 11, the DRAM 515 can be embodied by the memory 100 of FIG. 1. In this case, the DRAM 515 may be accessed by the base band processor 513 through a first channel and may also be accessed by an application processor not illustrated through a second channel. That is, one memory chip can be shared to be used by two processors.

Although the DRAM 515 is mounted in FIG. 11, in another case, a DRAM can be replaced with a MRAM.

A volatile memory device such as a SRAM or a DRAM loses its stored data when its power is interrupted.

A nonvolatile memory device such as a magnetic random access memory (MRAM) retains its stored data even after its power is interrupted. Thus, to maintain stored data even when power is poor or power is cut off, a nonvolatile memory device is preferably used to store data.

In the case that s spin transfer torque magneto resistive random access memory (STT-MRAM) constitutes a memory, an advantage of a MRAM may be added to an advantage of FIG. 1.

The STT-MRAM may include a magnetic tunnel junction (MTJ) device and a selection transistor. The MTJ device may basically include a fixed layer, a free layer and a tunnel layer formed between the fixed layer and the free layer. A magnetization direction of the fixed layer is fixed and a magnetization direction of the free layer may be the same as or reverse to the magnetization direction of the fixed layer depending on a condition.

Figure 12:
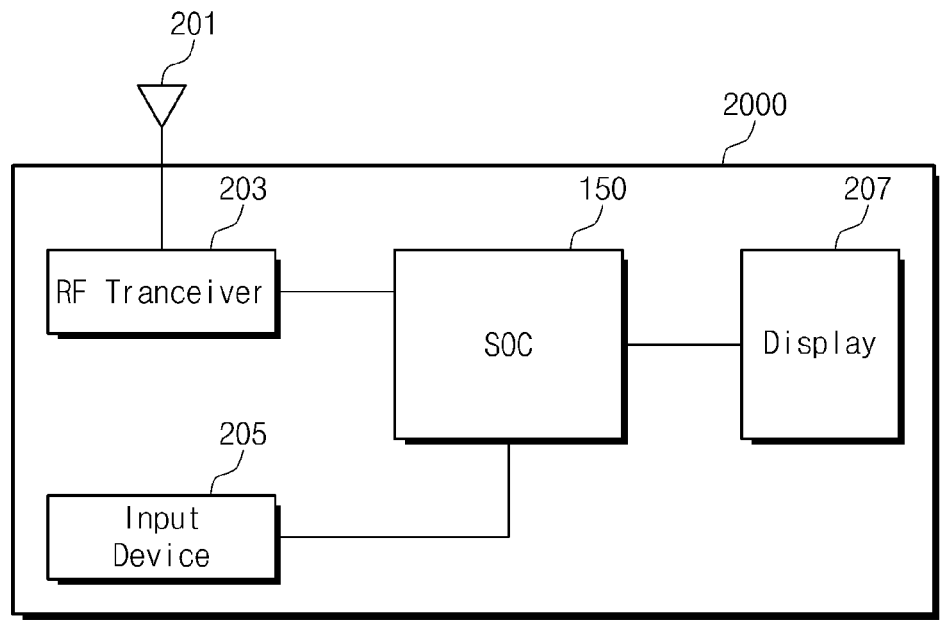
FIG. 12 is a block diagram illustrating an example application of example embodiments of inventive concepts applied to a data processing system including system-on-chip (SOC).

FIG. 12 is a block diagram illustrating an example application of example embodiments of inventive concepts applied to a data processing system including a system-on-chip (SOC).

Referring to FIG. 12, a data processing system 2000 may include a SOC 150, an antenna 201, an RF transceiver 203, an input device 205, and a display 207.

The RF transceiver 203 can transmit or receive a wireless signal through the antenna 201. The RF transceiver 203 can convert a wireless signal received through the antenna 201 into a signal that can be processed in the SOC 150.

Thus, the SOC 150 can process a signal output from the RF transceiver 203 and can transmit the processed signal to the display 207. The RF transceiver 203 can convert a signal output from the SOC 150 into a wireless signal and can output the converted signal to an external device through the antenna 201.

The input device 205 can be inputted with a control signal for controlling an operation of the SOC 150 or data to be processed by the SOC 150. The input device 205 can be embodied by a pointing device such as a touch pad and a computer mouse, a keypad, or a keyboard.

Since the SOC 150 in the data processing system of FIG. 12 can include the memory system of FIG. 1, a waste of a memory is minimized and power consumption can be reduced.

Figure 13:
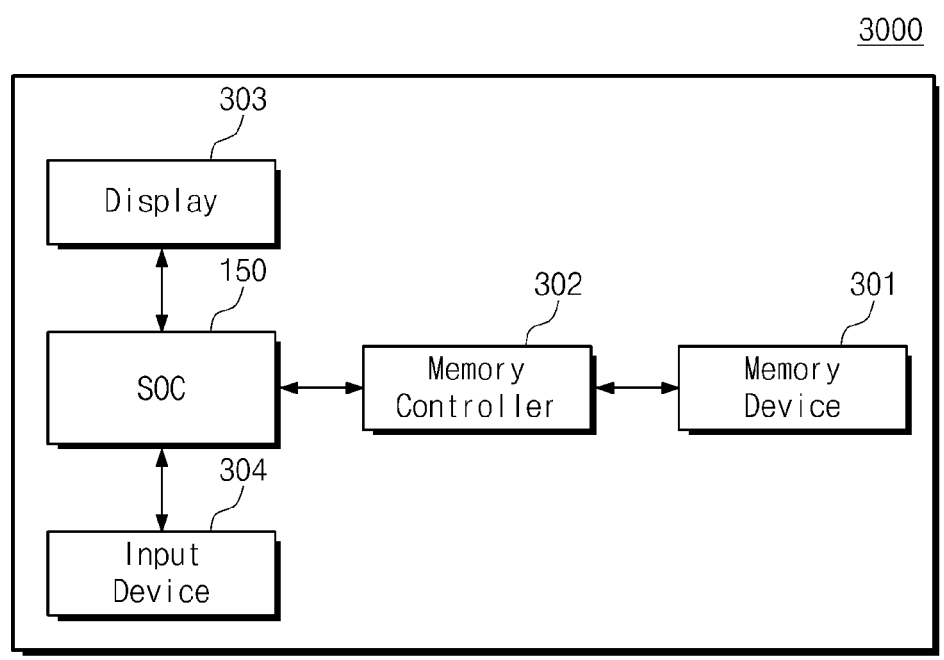
FIG. 13 is a block diagram illustrating an example application of example embodiments of inventive concepts applied to another data processing system.

FIG. 13 is a block diagram illustrating an example application of example embodiments of inventive concepts applied to another data processing system.

Referring to FIG. 13, a data processing system 3000 can be embodied in a personal computer (PC), a network server, a tablet PC, a net-book, an e-reader, a personal digital assistant (PDA), a portable multimedia player (PMP), a MP3 player, or a MP4 player.

The data processing system 3000 includes a SOC 150, a memory device 301, a memory controller 302 that can control a data processing operation of the memory device 301, a display 303 and an input device 304.

The SOC 150 receives data input through the input device 304. Data stored in the memory device 301 can be displayed through the display 303 according to a control operation and a processing operation. The input device 304 can be embodied by a pointing device such as a touch pad and a computer mouse, a keypad, or a keyboard. The SOC 150 can control the whole operation of the data processing system 3000 and can control an operation of the memory controller 302.

The memory controller 302 that can control an operation of the memory device 301 can be embodied as a part of the SOC 150 or can be embodied to be independent of the SOC 150.

Since the data processing system 3000 of FIG. 13 includes the memory system of FIG. 1, a waste of a memory is minimized and power consumption can be reduced.

The data processing system 3000 of FIG. 13 can be changed or expanded to one of various constituent elements of an electronic device, such as an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

Figure 14:
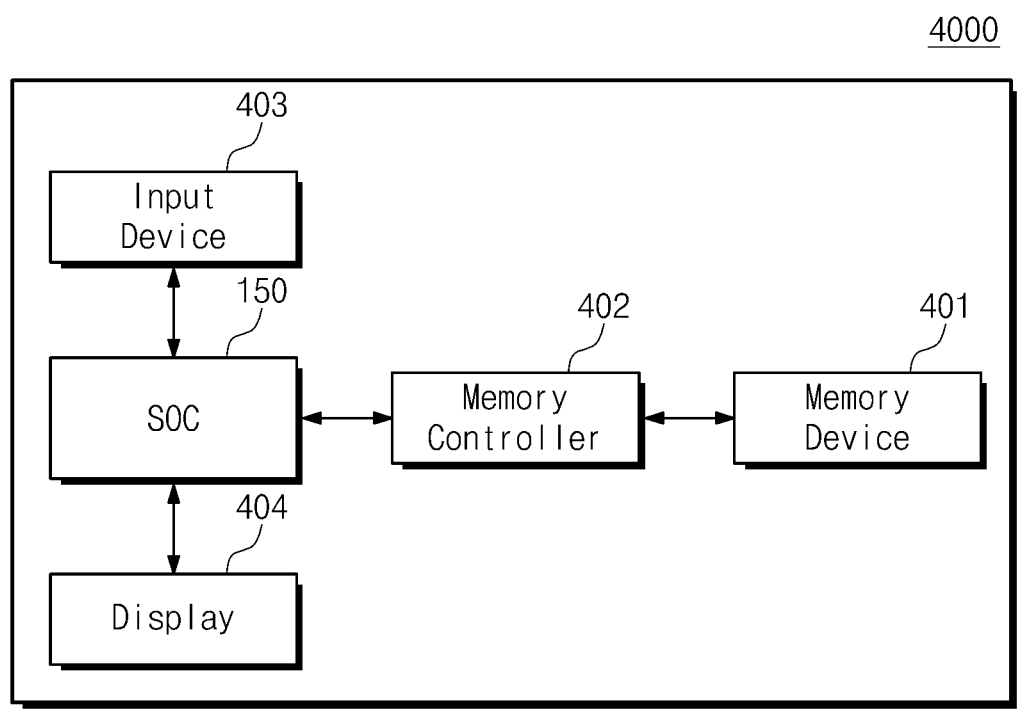
FIG. 14 is a block diagram illustrating an example application of example embodiments of inventive concepts applied to still another data processing system.

FIG. 14 is a block diagram illustrating an example application of example embodiments of inventive concepts applied to still another data processing system.

A data processing system 4000 including a SOC 150 illustrated in FIG. 14 can be embodied by an image processing device, for example, a digital camera, or a mobile phone or a smart phone fitted with a digital camera.

The data processing system 4000 includes a memory device 401 and a memory controller 402 that can control a data processing operation, for example, a write operation or a read operation. The data processing system 4000 further includes an image sensor 403 that can perform a function such as an input device and a display 404.

The image sensor 403 of the data processing system 4000 converts an optical image into digital signals and the converted digital signals are transmitted to the SOC 150 or the memory controller 402. According to a control of the SOC 150, the converted digital signals can be displayed through the display 404 or can be stored in the memory device 401 through the memory controller 402. Data stored in the memory device 401 is displayed through the display 403 according to a control of the memory controller 402.

Since the data processing system 4000 of FIG. 14 includes the memory system of FIG. 1 and is replaced by a memory block unit, a waste of a memory is minimized or reduced. Since a memory block including a weak memory cell is access-inhibited, power consumption of the memory system is reduced.

As discussed herein, a memory controller may be at least partially implemented as hardware, firmware, hardware executing software or any combination thereof. When implemented as hardware, such hardware may include, inter alia, one or more Central Processing Units (CPUs), digital signal processors (DSPs), application-specific-integrated-circuits (ASICs), field programmable gate arrays (FPGAs) computers or the like configured as special purpose machines to perform the functions of the memory controller. CPUs, DSPs, ASICs and FPGAs may generally be referred to as processors and/or microprocessors.

Although some example embodiments of inventive concepts have been shown and described, it will be appreciated by those skilled in the art that changes may be made in these embodiments without departing from the principles and spirit of the inventive concepts, the scope of which is defined in the appended claims and their equivalents. Therefore, the above-disclosed subject matter is to be considered illustrative, and not restrictive.

What is claimed is:

1. A method of managing failed memory of a semiconductor memory, the method comprising:
    importing, during execution of boot sequences prior to operation of an operating system, address information corresponding to at least one memory block having at least one failed memory cell, the at least one memory block being part of a page frame unit of a memory cell array;
    assigning at least one unit cache block as a replacement for the at least one memory block, the at least one unit cache block being smaller than the page frame unit of the memory cell array, the at least one unit cache block having a same storage capacity as the at least one memory block, and the page frame unit being a size of the memory cell array capable of being blocked by the operating system; and
    replacing the at least one memory block including the at least one failed memory cell with the at least one unit cache block.

2. The method of claim 1, wherein the at least one failed memory cell is a faulty memory cell.

3. The method of claim 1, further comprising:
    testing the memory cell array to detect the at least one failed memory cell.

4. The method of claim 3, wherein the testing of the memory cell array is performed prior to operation of the operating system.

5. The method of claim 3, wherein the testing of the memory cell array is performed periodically during access of a memory including the memory cell array.

6. The method of claim 1, wherein the at least one unit cache block replacing the at least one memory block is locked in software and no longer usable as cache memory.

7. The method of claim 1, wherein the at least one unit cache block is part of a lowest level cache memory among a plurality of cache memories utilized by the operating system.

8. The method of claim 1, wherein the at least one memory block is not recognized as a failed memory block by a processor executing the operating system.

9. The method of claim 1, wherein the memory cell array is part of a dynamic random access memory (DRAM) being used as a main memory.

10. The method of claim 1, wherein the memory cell array is part of a magnetic random access memory (MRAM) having a plurality of spin-transfer torque MRAM (STT MRAM) cells being used as a main memory.

11. A memory system comprising:
    a memory including a memory cell array, the memory cell array including a plurality of memory blocks, each of the plurality of memory blocks including a plurality of memory cells;
    a cache memory including a plurality of unit cache blocks, each of the plurality of unit cache blocks being smaller than a page frame unit of the memory cell array, the page frame unit being a size of the memory cell array capable of being blocked by an operating system, and the plurality of unit cache blocks having a same storage capacity as the plurality of memory blocks; and
    a memory controller configured to
        import, during execution of boot sequences prior to operation of the operating system, address information corresponding to at least one of the plurality of memory blocks having a failed memory cell, the at least one of the plurality of memory blocks being part of a page frame unit of a memory cell array, and
        replace the at least one of the plurality of memory blocks having the failed memory cell with a corresponding one of the plurality of unit cache blocks.

12. The memory system of claim 11, wherein the corresponding one of the plurality of unit cache blocks is locked in software to permanently replace the at least one of the plurality of memory blocks having the failed memory cell.

13. The memory system of claim 12, wherein when an address for accessing the at least one of the plurality of memory blocks having the failed memory cell is applied to the memory controller, the corresponding one of the plurality of unit cache blocks is accessed instead of the at least one of the plurality of memory blocks having the failed memory cell.

14. A memory system comprising:
    a memory controller configured to
        import, during execution of boot sequences prior to operation of an operating system, address information corresponding to a memory block having at least one failed memory cell, the memory block being part of a page frame unit of a memory cell array, and
        replace the memory block having the at least one failed memory cell with a unit cache block of a cache memory, the unit cache block being smaller than a page frame unit of a memory cell array, the page frame unit being a size capable of being blocked by the operating system, and the unit cache block having substantially the same storage capacity as the memory block.

15. The memory system of claim 14, wherein the unit cache block replacing the memory block is locked in software and no longer usable as cache memory.

16. The memory system of claim 14, wherein the memory controller is further configured to access the unit cache block instead of the memory block having the failed memory cell in response to an address for accessing the memory block having the failed memory cell.

17. The memory system of claim 14, further comprising:
a memory including the memory cell array having a plurality of memory blocks, the plurality of memory blocks including the memory block having the failed memory cell; and
the cache memory including the unit cache block.

* * * * *